United States Patent
Simpson et al.

[11] Patent Number: 6,000,550
[45] Date of Patent: Dec. 14, 1999

[54] WAFER CARRIER BOX HINGE

[75] Inventors: Tony Simpson, Savage; Michael S. Adams, Belle Plaine, both of Minn.

[73] Assignee: Fluoroware, Inc., Chaska, Mich.

[21] Appl. No.: 09/185,992

[22] Filed: Nov. 4, 1998

[51] Int. Cl.$^6$ .............. B65D 85/48; E05D 7/10
[52] U.S. Cl. .............. 206/711; 16/257; 16/267; 220/832; 220/840; 206/454
[58] Field of Search ................ 206/710–712, 206/832, 454; 220/843, 844, 832, 848, 840; 16/257, 269, 356, 374, 386, 267; 264/309, 328.1

[56] References Cited

U.S. PATENT DOCUMENTS

| | | |
|---|---|---|
| 2,527,318 | 10/1950 | Magnus . |
| 2,734,222 | 2/1956 | Kiba . |
| 2,960,254 | 11/1960 | Kiba ........................ 220/840 |
| 3,126,120 | 3/1964 | Crate ........................ 16/267 |
| 4,696,412 | 9/1987 | McGowan et al. ............ 220/832 |
| 5,255,783 | 10/1993 | Goodman et al. ............ 206/711 |
| 5,346,099 | 9/1994 | Salmon et al. ............ 220/832 |
| 5,529,205 | 6/1996 | Corney et al. ............ 220/932 |

Primary Examiner—Paul T. Sewell
Assistant Examiner—Luan K. Bui
Attorney, Agent, or Firm—Douglas J. Christensen

[57] ABSTRACT

A two part hinge for containers and boxes. The first part includes a pair parallel arms which include axially aligned opposing sockets which are configured to rotatingly receive pintle ends. The sockets are provided with radially disposed channels which extend from the sockets to exterior edges of the arms to form a slot for guiding the pintle ends into the sockets. The first hinge part also includes a dual function tab which is generally collaterally aligned with and parallel to the arms of the first part of the hinge. The tab is provided with a camming surface and a retaining surface. The camming surface engages and deflects the center portion of the pintle as it passes thereby, while the retaining surface maintains the pintle ends in the sockets by effectively blocking movement of the center portion of the pintle. The retaining surface of the tab is consistent with the arcuate surfaces of the sockets to form a smooth transition between the socket surfaces and the retaining surface of the tab. The second hinge part includes a pair parallel arms which project outwardly from the other of the container sections and which support a pintle or hinge pin, in such a fashion that the pintle ends extend beyond the lateral extent of the arms. To assemble the hinge, the pintle ends are slid into the channels toward the sockets. Assembly is essentially complete when the pintle body passes the camming portion of the tab.

16 Claims, 3 Drawing Sheets

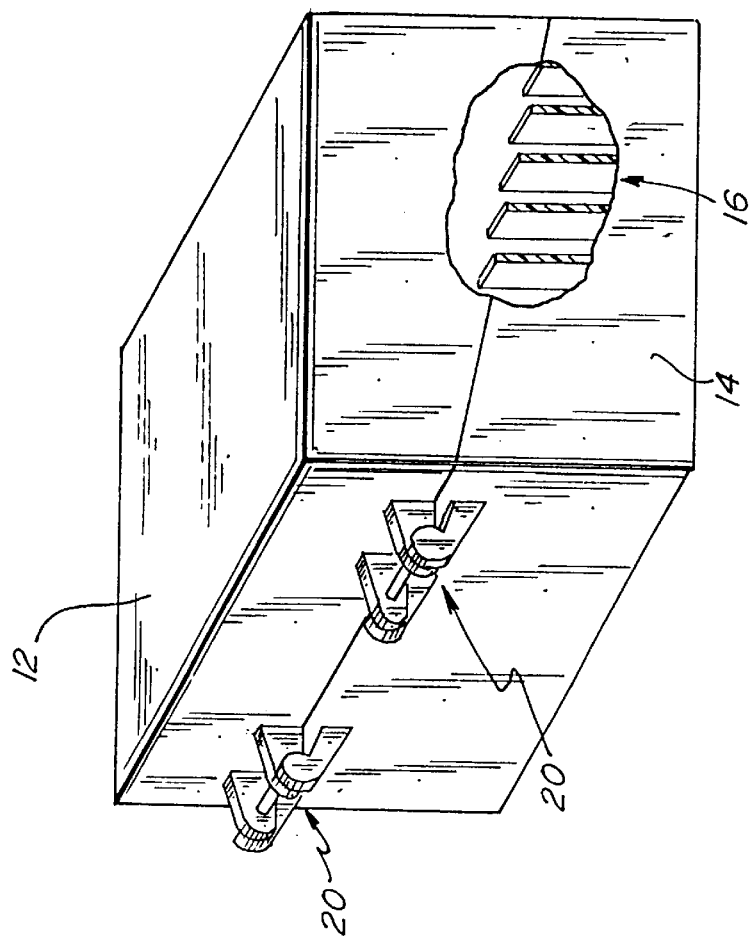
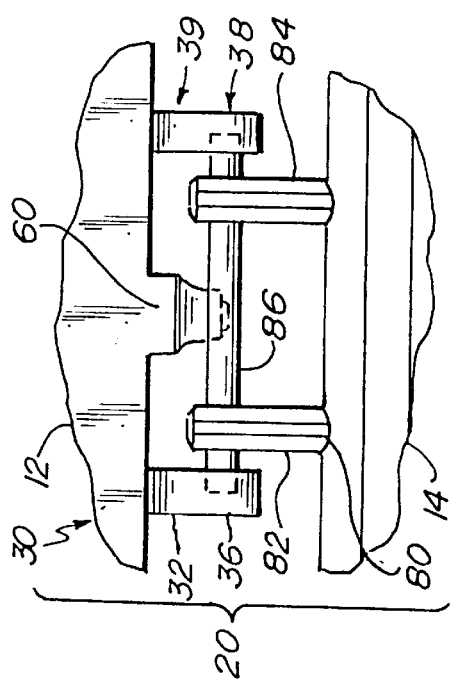
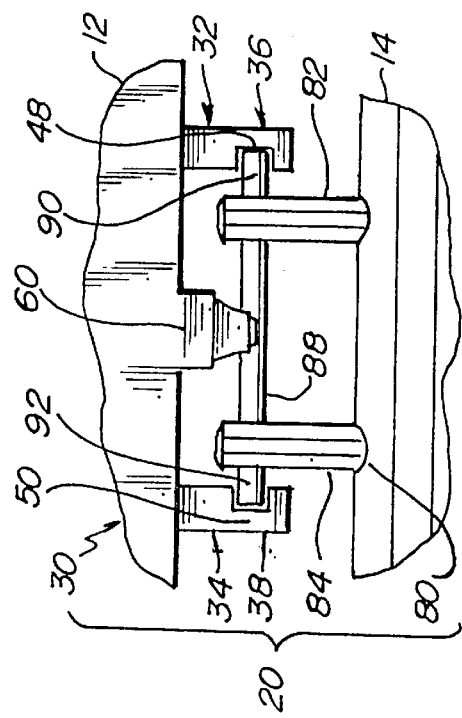

WAFER CARRIER BOX HINGE

This is a utility application based on U.S. Provisional Patent Application 60/065,954, filed Nov. 4, 1997.

BACKGROUND OF THE INVENTION

The present invention relates generally to a hinge for containers, and more particularly to a two-part hinge for use in semi-conductor wafer containers and boxes.

Containers are used in many applications within the semiconductor industry to protect components from contaminants, breakage and misplacement. These containers usually incorporate existing hinges, which typically comprise living hinges or traditional hinges with removable hinge pins or pintles which are received in barrels or knuckles of hinge segments.

These hinges are not without their drawbacks. With a living hinge, there is a tendency to resist flexation due to memory in the material. Thus, a container with a living hinge will not open and close freely within its operating range. Resistance must be overcome, and frequently the hinge must be overflexed in order to avoid reversion to a prior position. Over time, such hinges lose their effectiveness and eventually may fatigue and fail. Once such failure has occurred, the entire container must be scrapped. Additionally, if one section of the container breaks, the entire container must be scrapped.

With traditional hinge construction, hinge leaves are attached to each other by a pintle. The pintle is usually fabricated out of a different, more wear resistant material than the hinge leaves. Thus, after a period of time, the barrels or knuckles of the hinge leaves wear out. This results in improper operation of the hinge and container sealing ability suffers. Additionally, when the barrels or knuckles wear out, the pintle is prone to dislodgement and/or loss, thus rendering the hinge inoperative for its intended use. Another drawback is that pintles are often made out of metal, such as steel, which is prone to oxidation. As oxidants build up, the operation of the hinge suffers and becomes less efficient. And, depending upon the particular environment, the pintles can discolor or otherwise mar the hinge leaves. Moreover, metal is a very undesirable material for wafer carriers due to potential contamination problems.

Attempts have been made to solve the above-mentioned drawbacks. For example, U.S. Pat. No. 2,527,318 issued to Magnus, Oct. 24, 1950, discloses a plastic hinge construction for boxes and the like. In this patent, the hinge parts are integral with the container segments, with one of the hinge parts including a hinge pin, and the other hinge part including semicircular grooves and a resilient tongue member. When assembled, the tongue member exerts a force against the hinge pin to maintain the hinge pin in contact against the semicircular grooves.

U.S. Pat. No. 2,734,222 issued to Kiba, Feb. 14, 1956, discloses a hinge structure for molded boxes. This patent, like Magnus, teaches integral hinge construction. Assembly differs, however, in that the pintle ends of Kiba are received in a pair of bight portions and the pintle body is engaged by a stop to permanently retain the pintle ends within the bights. With Kiba, the stop is attached to a thinned wall portion of a container section, and the thinned wall portion is deflected by the pintle as it passes thereby. Note that the hinge is preferably assembled shortly after the container halves have been removed from their molds. This is because warm plastic is still relatively pliable and has not set. After assembly, and once the plastic has set, the assembled hinge is considered permanent.

The problem with the above-mentioned hinges is that they are structurally weak and/or they are not designed to be separated after assembly.

There is a need for a hinge which may be integrally formed with sections of a container, which may be easily assembled and disassembled, and which provides a strong, long lasting pivot joint.

SUMMARY OF THE INVENTION

A hinge for use in containers and boxes used in semi-conductor wafer industry. The hinge comprises two complementary shaped parts which are integral to halves of a closable container. The first part includes a pair of parallel arms which project outwardly from one of the container sections. The arms include receiving portions which include axially aligned opposing partial sockets or cavities which are configured to rotatingly receive pintle or hinge pin ends. In order to facilitate assembly and disassembly, the partial sockets are provided with radially disposed channels or notches which extend from the sockets to an exterior edge of the receiving portion to form a slot for guiding the pintle ends into the receiving portions of the arms. In the preferred embodiment, the channels extend in a generally vertical direction.

The first hinge part also includes a dual function tab. The tab is positioned between, and generally coextensive with the parallel arms of the first part of the hinge. The tab performs two functions, the first during assembly, the second after assembly. The first function of the tab is to deflect the body of the pintle as it passes thereby along the slot defined by opposed channels in the receiving portions of the arms. The second function of the tab is to retain the pintle ends within the partial sockets of the receiving portions of the arms after the pintle has passed the tab and returned to its normal undeflected state.

To that end, the tab is designed with a camming surface and a retaining surface. The camming surface is preferably in the form of a raised spine which extends along the longitudinal extent of the tab. The raised spine camming surface performs the first function of the tab by engaging and deflecting the body of the relatively more resilient pintle as it passes thereby. After the pintle body passes the camming surface it snaps back to its undeflected state.

Once the pintle body has passed the camming surface of the tab and the pintle ends are received in the partial sockets or cavities of receiving portions, the pintle body is engaged by a retaining surface of the tab. The retaining surface of the tab extends a sufficient distance into the plane of the slot created by the channels of the receiving portions to prevent unintentional or accidental withdrawal of the pintle from the partial sockets or cavities. Note that the retaining surface of the tab is consistent with the arcuate surfaces of the partial sockets to form a smooth transition between the partial socket surfaces and the retaining surface of the tab.

The second hinge part includes a pair of parallel arms which project outwardly from the other of the container sections and which support a pintle or hinge pin, so that the pintle ends extend beyond the arms.

In use, a container may be provided with a single hinge or multiple hinges, if desired or as required.

For purposes of this application, "pintle" or "hinge pin" refers generally to functional rather than structural aspects of the invention, that function being rotation of the complementary shaped hinge parts relative to each other about a common axis. It should be apparent, then, that the hinge parts may be varied or modified without departing from the spirit and scope of the invention. For example, the center portion of the pintle need not have the same cross-sectional dimensions as the pintle ends. The center portion of the pintle may have a larger cross-sectional dimension, a smaller cross-sectional dimension, or different geometric cross-sectional configuration (such as a square, or oval). When varying or modifying the center portion of the pintle, the only requirement is that the center portion be deflectable relative to the tab of the first hinge part.

One common material used for injection molding such containers or boxes is carbon filled (either powder or fibre) polypropylene. This material can have relatively high flexural and creep rates which make conventional hinges less than ideal and subject to inadvertent detachment.

A principal object of the present invention is to provide an improved two part hinge for a container.

Another object of the present invention is to simplify assembly of a container.

Still another object of the present invention is to facilitate disassembly of the hinge halves.

A feature of the present invention is a dual functioning tab.

Another feature of the tab of the present invention is a camming surface which temporarily displaces the body of the pintle as is passes thereby.

Another feature of the tab is the raised spine which forms the camming surface and strengthens the tab.

Another feature of the invention is that the body of the pintle is deflected during assembly of the hinge.

Still another feature of the tab is the retaining surface which retains the ends of the pintle in partial sockets of support arms.

Yet another feature of the tab is the arcuate shape of the retaining surface.

An advantage of the present invention is that container sections may be easily assembled and disassembled without special tools.

Another advantage of the present invention is that assembly of the hinge portions is indicated by an audible signal.

Still another advantage of the present invention is that various container sections may be interchangeably attached to each other.

These, and other objects, features and advantages of the invention will become more readily apparent to those skilled in the art from the detailed description and the accompanying drawings.

BRIEF DESCRIPTION OF THE DRAWINGS

FIG. 2A is a partial top view of the hinge showing the first and second hinge parts of the present invention in an assembled extended state in which the container is in an open position;

FIG. 2B is a partial bottom view of the hinge showing the first and second hinge parts of the present invention in an assembled extended state in which the container is in an open position;

FIG. 9 is a perspective view of a typical container which features hinges of the present invention, with a break-out showing the arrangement of interior support webs;

DETAILED SPECIFICATION

Figure 1A:
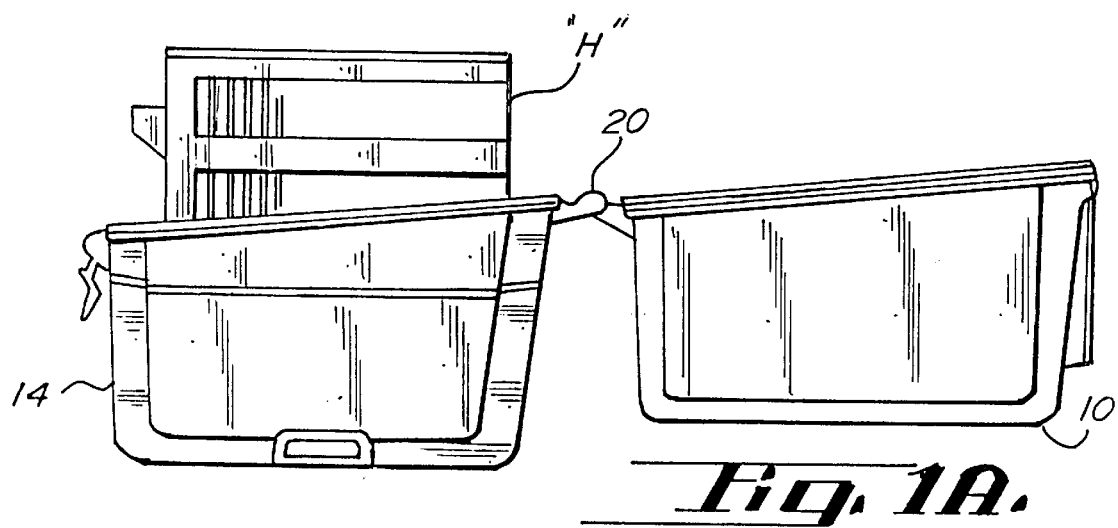
FIG. 1A is a side view of a container featuring the hinge of the present invention, with the container in an open position for insertion and/or removal of an H-bar style semi-conductor wafer carrier.
Figure 1B:
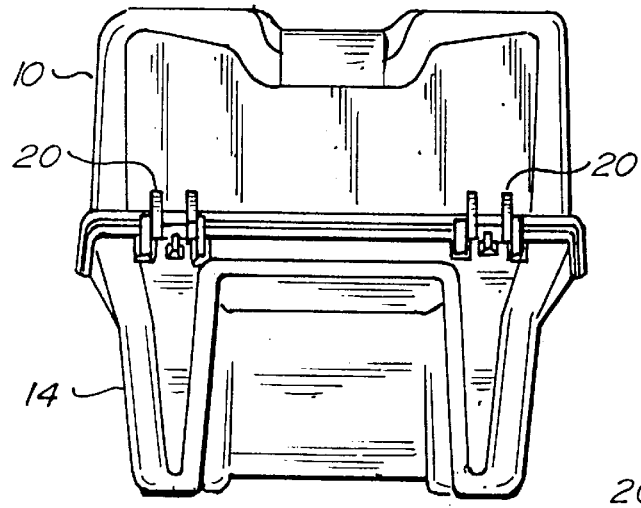
FIG. 1B is a rear plan view of a container featuring the hinge of the present invention with the container in a closed position.
Figure 1C:
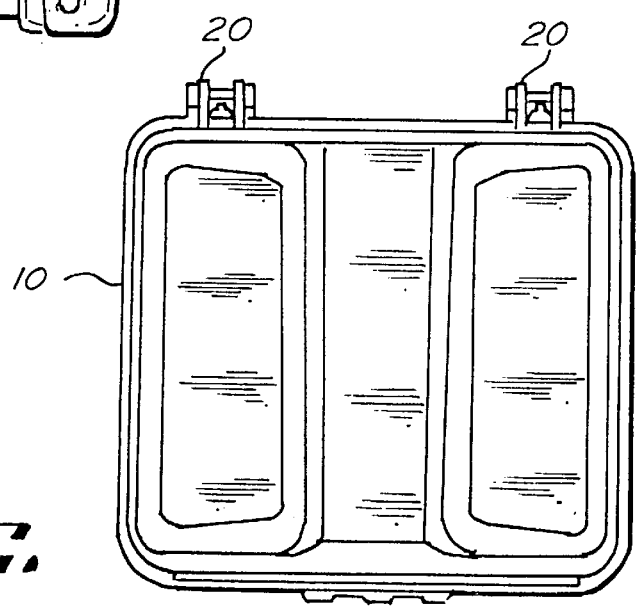
FIG. 1C is a top view of a container featuring the hinge of the present invention with the container in a closed position.

Referring to FIGS. 1A, 1B, and 1C, hinges 20 can be seen as they are used in conjunction with containers which are designed to hold wafer carriers. The containers as shown are common in the semiconductor processing industry and are commonly known as WIP (work in progress) boxes. Typically they are able to hold a frame "H" which is designed to hold a plurality of semi-conductor wafer blanks.

Referring to FIG. 2A, hinge 20 comprises two parts 30, 80 which are attached to first and second sections or halves 12, 14 of a closable container 10. First or female part 30 comprises a first arm 32, a second arm 34, and a tab 60. First arm 32, second arm 34 and tab 60 extend outwardly from an exterior wall of the first section 12 of the container 10 in a generally perpendicular direction. Note that first arm 32, second arm 34 and tab 60 are collaterally aligned with each other and that tab 60 is positioned between arms 32, 34. Second or male part 80 comprises a third arm 82 and a fourth arm 84 which extend outwardly from an exterior wall of the second section 14 of container 10 in a generally perpendicular direction. Third and fourth arms 82, 84 are collaterally aligned and are configured to support a pintle or hinge pin 86 so that it is spaced from the second section 14 of container 10.

Referring to FIG. 2B, first and second arms 32, 34 of first hinge part 30 first and second receiving portions 36, 38. First and second receiving portions 36, 38 include first and second medial or inwardly facing surfaces 40, 42 with first and second partial sockets or cavities 44, 46 (see FIG. 3). The partial sockets 44, 46 are configured to rotatingly engage ends of pintle 86. To facilitate attachment of first hinge part 30 to second hinge part 80, each partial socket 44, 46 is provided with a channel or notch 48, 50 which extends radially therefrom in a direction transverse to the longitudinal axis of the arms 32, 34. The channels 48, 50 form a slot which receives pintle end 90, 92 of second hinge part 80. Pintle ends 90, 92 are maintained within the partial sockets 44, 46 by tab 60 which engages the center portion 88 of pintle 86.

Figure 3:
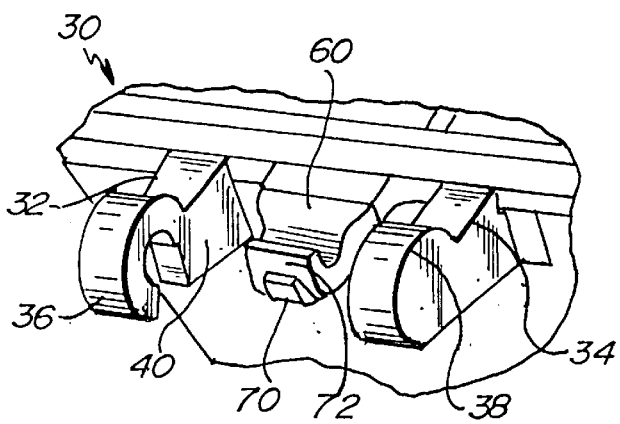
FIG. 3 is a perspective view showing the first part of the hinge of the present invention.

Referring to FIG. 3, the juxtaposition of the tab 60 between arms 32, 34 can be seen. Turning to the first arm 32, the channel or notch 48 extends radially from partial socket or cavity 44 in a transverse direction across the arm 32. Preferably, the channel opens downwardly. Tab 60 retains the first and second hinge parts 30, 80 together by engaging the center portion of pintle 86. During assembly and disassembly, a first pintle engagement or camming surface 70 of tab 60, which is substantially more rigid than pintle 86, deflects center portion 88 as second hinge part 80 is slid into the slot created by channels 48, 50 (see FIG. 7). In the assembled state, second hinge part 80 is retained by a second pintle engagement or retaining surface 72 of tab 60.

Figure 4:
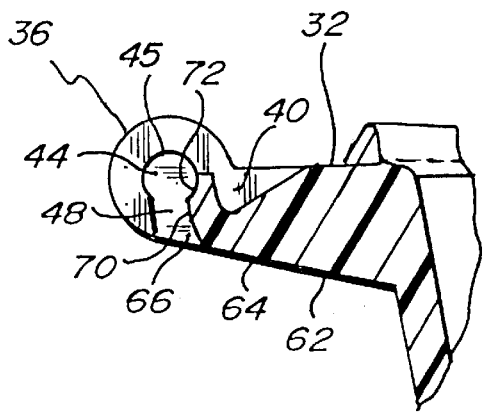
FIG. 4 is a partial, cross-sectional side view of FIG. 3 taken along the longitudinal axis of the tab.

Referring to FIG. 4, tab 60 comprises a projection 62 with a thinned portion 64 which terminates in a tongue 66. Second retaining surface 72 of tab 60 is arcuately consistent with arcuate surface 45 of partial socket 44. Note that tongue 66 extends into the plane defined by channels 48, 50 to prevent accidental or unintended movement of the pintle ends 90, 92 within channels 48, 50.

Figure 5:
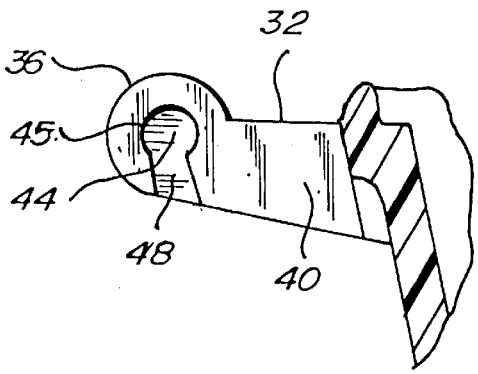
FIG. 5 is a side view of the medial or interior surface of one of the arms of FIG. 3.

Referring to FIG. 5, partial socket 44 and channel 48 of receiving portion 36 of arm 32 can be seen. Note that the width of partial socket 44 defined by circumferential surface 45 is slightly larger that the width of channel 48. The comparatively smaller channel 48 forms a constriction through which the pintle end 90 frictionally passes—until it reaches the partial socket 44 where it may freely rotate.

Figure 6:
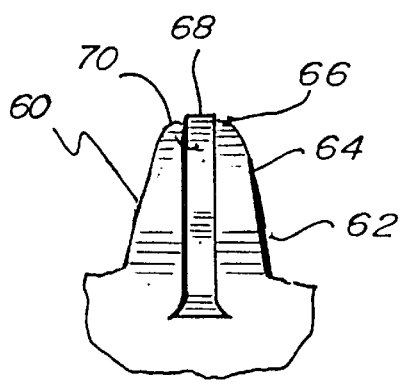
FIG. 6 is a bottom plan view of the tab of FIG. 3.

Referring to FIG. 6, tab 60 camming surface 68 comprises a raised spine 70 which extends along the length of tab 60 to end of tongue 66. Raised spine 70 also functions as a strengthening rib which enables tab 60 to resist deflection as it engages the comparatively more resilient center portion 88 of pintle 86. Tab 60 is tapered as it extends outwardly from first section 12 of container 10, the tapering also adding strength to tab 60.

Figure 7:
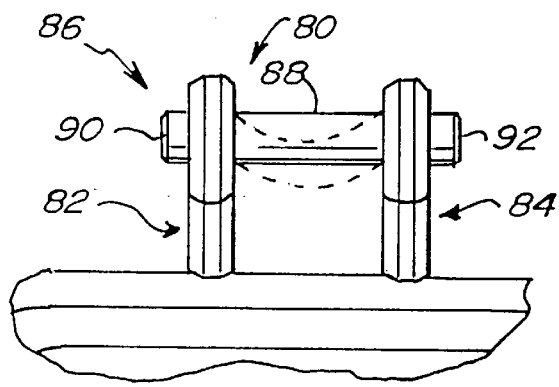
FIG. 7 is a top plan view of the second half of the hinge of the present invention.

Referring to FIG. 7, center portion 88 of pintle 86 is shown in an undeflected or relaxed state in solid lines, and in a deflected state in dashed lines. In the deflected state, the center portion 88 of pintle 86 (which is substantially more resilient than tab 60) is able to move past tab 60 and into assembly with first hinge portion 30. By having the center portion 88 of pintle 86 deflect in favor of the tab, the container sections 12, 14 are less prone to wear and tear.

Figure 8:
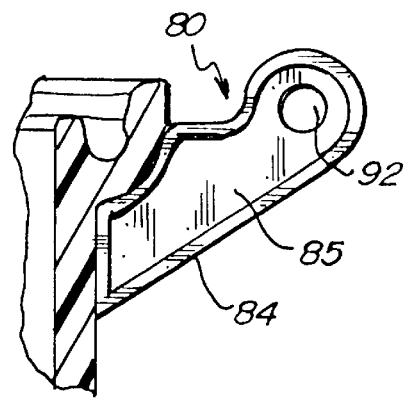
FIG. 8 is a side view of the second part of the hinge of the present invention showing the lateral or exterior surface of one of the arms.

Referring to FIG. 8, fourth arm 84 of second hinge part 80 includes a lateral or outer surface 85 which is configured to slidingly engage medial or inner surface 42 of second arm of first hinge part 30. These surfaces 85, 42 prevent excessive lateral movement of pintle ends 90, 92 within partial sockets 48, 50.

Referring to FIG. 9, hinges are shown as attached to a container 10 having of the type having a first section 12 and a second section 16, with the hinge generally designated with the numeral 20. As depicted, a container 10 may include a plurality of hinges 20 if desired, or required. The working environment of the particular containers which use the hinge of the invention is preferably in the semi-conductor fabrication industry. Containers of this type generally include integral semi-conductor wafer holders or webs 16 shown in the break-out of FIG. 1 and/or they are capable of retaining a device which holds a plurality of semi-conductor wafers (see FIG. 9A).

To assemble the hinge 20, the pintle ends 90, 92 of pintle or hinge pin 86 are aligned with the channels 48, 50 of first and second receiving portions 36, 38 of arms 32, 34. The first and second parts or halves 30, 80 are then squeezed together. As the pintle ends 90, 92 of hinge pin 86 slide within the channels 48, 50, the center portion 88 of pintle 86 encounters the camming surface 70 of tab 60. The center portion 88 of the pintle 86 (being relatively elastic) is deflected from its normal position by the camming surface 70 of tab 60. Once the center portion 88 passes camming surface 70, it returns to its normal position. As the center portion 88 returns to its normal undeflected state, it engages the retaining surface 72 of tab 60. The pintle ends 90, 92 are thereby rotatably retained in position by the retaining surface 72 of the tab 60 which partially completes the partial sockets 44, 46 of the first and second arms 32, 34. To disassemble the hinge 20, the center portion 88 of pintle 86 is deflected from its normal position to disengage from the retaining surface 72 of tab 60, and the pintle ends 90, 92 are slid along the channels 48, 50 in arms 32, 34.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

We claim:

1. A hinge for use in semi-conductor wafer storage boxes of the type having two sections, the hinge comprising:
   a. a first arm with a socket and a second arm with a socket, the sockets in confronting, axial relationship;
   b. each respective arm having a pair of channels extending radially from the sockets, the channels forming a slot for receiving ends of a pintle;
   c. a tab, the tab coextensive with the first and second arms, the tab having a camming surface;
   d. a third arm and a fourth arm; the third and fourth arm supporting a pintle having a center portion and ends;
   wherein the first arm, the second arm and the tab are attached to a first section of the container and the third arm and the fourth arm are attached to a second section of the container; and,
   wherein the center portion of the pintle is temporarily deflected as the pintle is moved in the slot toward the sockets during assembly of the hinge.

2. The hinge of claim 1, the tab further comprising a retaining surface for preventing unintentional movement of the pintle ends along the channels.

3. The hinge of claim 2, the retaining surface is arcuate.

4. The hinge of claim 1, the camming surface comprising a raised spine.

5. A hinge in combination with a container of the type having two sections and used to hold semi-conductor wafers used in computer chip fabrication, the hinge comprising:
   a. a first arm with a socket and a second arm with a socket, the sockets in confronting, axial relationship;
   b. a pair of channels extending radially from the sockets along the respective arms, the channels forming a slot for receiving ends of a pintle;
   c. a tab, the tab coextensive with the first and second arms, the tab having a camming surface;
   d. a third arm and a fourth arm; the third and fourth arm supporting a pintle having a center portion and ends;
   wherein the first arm, the second arm and the tab are attached to a first section of the container and the third arm and the fourth arm are attached to a second section of the container; and,
   wherein the center portion of the pintle is temporarily deflected as the pintle is moved in the slot toward the sockets during assembly of the hinge.

6. The hinge of claim 5, wherein the container is a semi-conductor wafer carrier container.

7. The hinge of claim 5, wherein the container is a semi-conductor wafer container.

8. A semi-conductor wafer container comprising:
   a. a first section, the first section having a first sidewall attached to a plurality of sidewalls and a top wall, a first hinge part attached to the first sidewall, the first section having a first arm and a second arm, the first arm, and second arm projecting outwardly in a generally perpendicular direction from the first sidewall in a collateral alignment; the first and second arms having opposing channels which define a slot, the slot generally perpendicular with the longitudinal axes of the first and second arms, the channels sized to slidingly accept pintle ends moving therealong;

b. a second section, the second section having a second sidewall attached to a plurality of sidewalls and a bottom wall, a second hinge part attached to the second sidewall, the second section having a third arm and a fourth arm, the third arm and the forth arm projecting outwardly in a generally perpendicular direction from the second sidewall, the third and forth arms supporting a pintle having a center portion and ends;

wherein container sections may be assembled to each other by sliding the pintle ends of the second hinge part along the channels of the first hinge part.

9. The semi-conductor wafer container of claim 8, further comprising a tab, the tab collaterally aligned with the first and second arms of the first hinge part, the tab including a camming surface for engaging and deflecting the pintle center portion as the pintle ends slide along the channels of the first hinge part during assembly.

10. The semi-conductor wafer container of claim 9, the tab further comprising a retaining surface, the retaining surface configured to prevent unintentional movement of the pintle ends along the channels.

11. The semi-conductor wafer container of claim 8 wherein the container comprises an H-bar wafer carrier container.

12. The semi-conductor wafer container of claim 8 wherein the container is configured to hold wafers in a spaced relation.

13. A method of making a hinged container for semi-conductor wafers, the method comprising the steps of:

a. injection molding a first section of a container, the container having a first sidewall attached to a plurality of sidewalls and a top wall, a first hinge part attached to the first sidewall, the first section having a first arm, a second arm, and a tab, the first arm, second arm and tab projecting outwardly in a generally perpendicular direction from the first sidewall in a collateral alignment; the first and second arms having opposing channels which define a slot, the slot generally transverse to the longitudinal axes of the first and second arms, the channels sized to sliding accept pintle ends moving therealong; the tab including pintle engagement surfaces;

b. injection molding a second section of a container, the container having a second sidewall attached to a plurality of sidewalls and a bottom wall, a second hinge part attached to the second sidewall, the second section having a third arm and a fourth arm, the third arm and the forth arm projecting outwardly in a generally perpendicular direction from the second sidewall in a collateral relation, the third and forth arms supporting a pintle having a center portion and ends;

c. assembling the first and second sections together.

14. The method of claim 13, wherein the step of assembling the first and second sections together comprises the steps of:

i) sliding the pintle ends along the slot defined by the channels in the first hinge part; and ii) deflecting the center portion of the pintle as it engages a first pintle engagement surface of the tab.

15. The method of claim 14, wherein the step of assembling the first and second sections together further comprises the step of:

iii) retaining the pintle ends within the slot after the center portion of the pintle is disengaged from the first pintle engagement surface of the tab.

16. The method of claim 15, wherein the step of retaining the pintle ends within the slot comprises the step of:

iv) providing the tab with a second, arcuately shaped engagement surface configured to slidingly engage the center portion of the pintle as it rotates about its axis.

* * * * *